United States Patent
Vadipour

(10) Patent No.: US 6,300,804 B1
(45) Date of Patent: Oct. 9, 2001

(54) DIFFERENTIAL COMPARATOR WITH DISPERSION REDUCTION CIRCUITRY

(75) Inventor: Morteza Vadipour, Woodland Hills, CA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 09/501,471

(22) Filed: Feb. 9, 2000

(51) Int. Cl.[7] ............................................. H03K 5/22
(52) U.S. Cl. ............................ 327/63; 327/52; 327/65
(58) Field of Search ............................. 327/52, 56, 63, 327/65, 77, 90, 96, 50

(56) References Cited

U.S. PATENT DOCUMENTS

| | | | |
|---|---|---|---|
| 4,121,120 | * 10/1978 | Wetterling | 327/96 |
| 4,754,169 | 6/1988 | Morris | 327/307 |
| 5,245,223 | 9/1993 | Lim et al. | 327/80 |
| 5,355,391 | 10/1994 | Horowitz et al. | 357/36 |
| 5,416,484 | 5/1995 | Lofstrom | 341/159 |
| 5,491,434 | * 2/1996 | Harnishfeger et al. | 327/50 |
| 5,512,848 | 4/1996 | Yaklin | 327/65 |
| 5,517,134 | 5/1996 | Yaklin | 327/65 |
| 5,530,444 | 6/1996 | Tice et al. | 341/156 |
| 5,541,538 | 7/1996 | Bacrania et al. | 327/77 |
| 5,563,598 | 10/1996 | Hickling | 341/155 |
| 5,701,331 | 12/1997 | Hunt | 357/316 |
| 5,764,086 | 6/1998 | Nagamatsu et al. | 327/65 |
| 5,801,554 | 9/1998 | Momma et al. | 327/89 |
| 5,812,005 | 9/1998 | Ezell et al. | 327/307 |
| 5,864,587 | 1/1999 | Hunt | 327/316 |
| 5,912,567 | 6/1999 | Drost et al. | 327/89 |
| 5,942,921 | 8/1999 | Talaga, Jr. | 327/77 |
| 5,973,957 | 10/1999 | Tedrow | 365/185.03 |
| 5,996,102 | 11/1999 | Havlin | 714/740 |
| 5,999,028 | 12/1999 | Knoch et al. | 327/165 |
| 6,016,566 | 1/2000 | Yoshida | 714/736 |

OTHER PUBLICATIONS

Web Page Literature, LTX Corp., "HiPerPhase Differential I/O: How Fusion meets the challenges of testing digital signals", date unknown.

* cited by examiner

Primary Examiner—Tuan T. Lam
Assistant Examiner—Hiep Nguyen
(74) Attorney, Agent, or Firm—Lance M. Kreisman

(57) ABSTRACT

A differential comparator is disclosed including first and second input amplifier circuits. The input amplifier circuits have respective signal input terminals for receiving respective first and second complementary input signals and respective output terminals. The first and second input amplifier circuits cooperate to produce a difference signal. Reference signal circuitry is coupled to the input amplifier circuits and is operative to produce a predetermined reference signal for comparison to the difference signal. The input amplifier circuits and the reference signal circuitry cooperate to define a single stage.

6 Claims, 3 Drawing Sheets

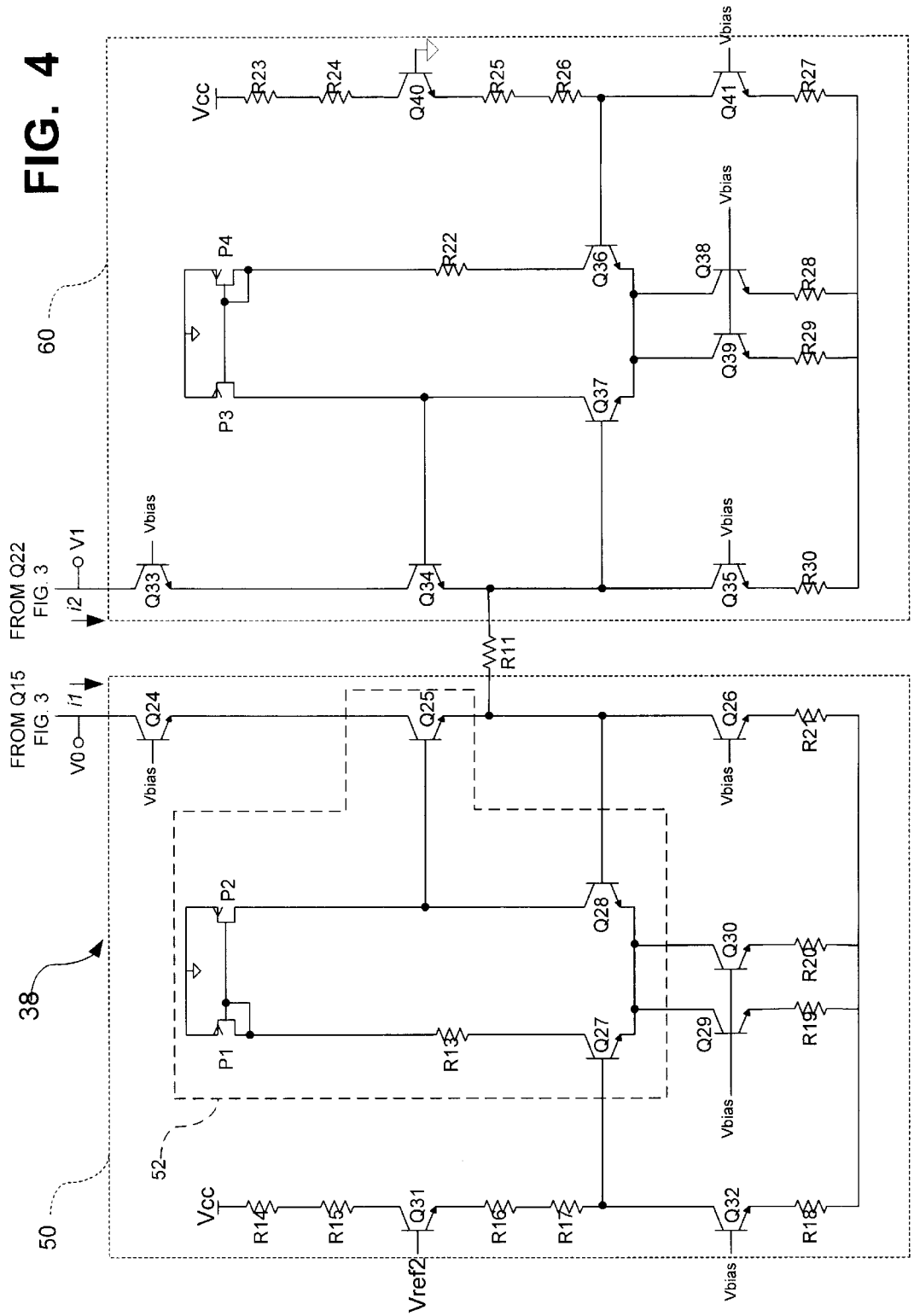

DIFFERENTIAL COMPARATOR WITH DISPERSION REDUCTION CIRCUITRY

FIELD OF THE INVENTION

The invention relates generally to automatic test equipment and more particularly a differential comparator having dispersion reduction circuitry for use in automatic test equipment.

BACKGROUND OF THE INVENTION

Differential comparators are often used to detect differential signals and to compare the detected quantity to some predefined threshold. Conventional differential comparators generally employ a multi-stage differential construction 20, as shown in FIG. 1. The stages correspond to a methodology of first detecting the differential voltage, then comparing the detected voltage to a reference voltage. The first stage, or input stage, comprises a differential amplifier 22 that includes respective differential inputs V2 and V1 and produces an output voltage (V2−V1) proportional to the detected difference signal. The output is fed for comparison as an input to a second stage, or threshold stage, that includes a differential amplifier 24 for comparison to a reference voltage Vref at a second input of the second stage. While the multi-stage configuration works well for its intended low performance applications, at high data rates the multi-stage structure generally becomes overly susceptible to a signal inaccuracy known as dispersion.

Dispersion is often recognized by those skilled in the art as the change in response time, or change in propagation delay, between the input and output of an electronic device. In contrast to a fixed propagation delay that can be measured, predicted and repeatedly calibrated out of a measurement with high accuracy, a changing propagation delay creates prediction inaccuracies with signal timings that may undesirably affect the overall measurement accuracy of the comparator. Typically, dispersion varies as a complex function of threshold signal level, frequency, and temperature.

What is needed and heretofore unavailable is a differential comparator that minimizes the effects of dispersion. The need also exists for the implementation of such a comparator in the pin electronics of a semiconductor tester to maximize accuracy and performance. The differential comparator of the present invention satisfies these needs.

SUMMARY OF THE INVENTION

The differential comparator of the present invention provides high accuracy semiconductor device testing for high bandwidth applications while minimizing dispersion effects on differential signals. This correspondingly results in higher tester accuracy and performance.

To realize the foregoing advantages, the invention in one form comprises a differential comparator including first and second input amplifier circuits. The input amplifier circuits have respective signal input terminals for receiving respective first and second complementary input signals and respective output terminals. The first and second input amplifier circuits cooperate to produce a difference signal. Reference signal circuitry is coupled to the input amplifier circuits and is operative to produce a predetermined reference signal for comparison to the difference signal. The input amplifier circuits and the reference signal circuitry cooperate to define a single stage.

In another form, the invention comprises a method of comparing a differential signal defined by complementary first and second signals to a reference signal. The method includes the steps of differentially amplifying the first and second signals with a differential amplifier having complementary first and second input amplifier circuits with respective complementary signal inputs for receiving the first and second signals; impressing a reference signal across the reference signal circuit; and comparing the detected difference signal to the reference signal.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which

FIG. 4 is a more detailed schematic of the voltage/current converter shown in FIG. 2.

DETAILED DESCRIPTION OF THE INVENTION

Figure 1:
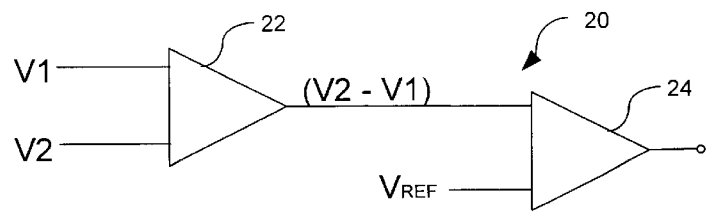
FIG. 1 is a high-level block diagram schematic of a conventional multi-stage differential comparator construction.
Figure 2:
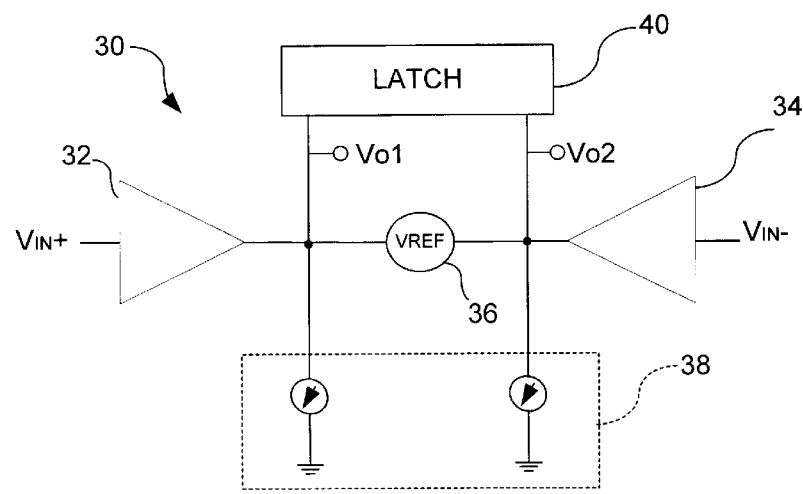
FIG. 2 is a high-level block diagram schematic of a differential comparator according to one form of the present invention.

Dispersion, or the change in propagation delay between the input and output of an electronic device, often has a significant impact in the obtainable accuracy of a semiconductor tester. Referring to FIG. 2, to minimize the effects of dispersion for carrying out differential comparisons of output signals from a device-under-test (DUT) to expected signals, the present invention in one form comprises a differential comparator, generally designated 30, that employs voltage reference circuitry 36 that cooperates with input circuitry 32 and 34 to form a single stage differential comparator construction.

Further referring to FIG. 2, the differential comparator 30 generally includes respective first and second input amplifier circuits 32 and 34 for receiving complementary differential input signals Vin+ and Vin− from the DUT (not shown). The voltage reference circuitry 36 couples to the respective input amplifier circuits and generates a reference voltage for comparison to the difference voltage (Vin+−Vin−). For applications that utilize a latching capability, latch circuitry 40 couples to the respective input amplifier circuits to selectively latch a logic state in accordance with predetermined conditions between the reference voltage and the difference voltage.

Figure 3:
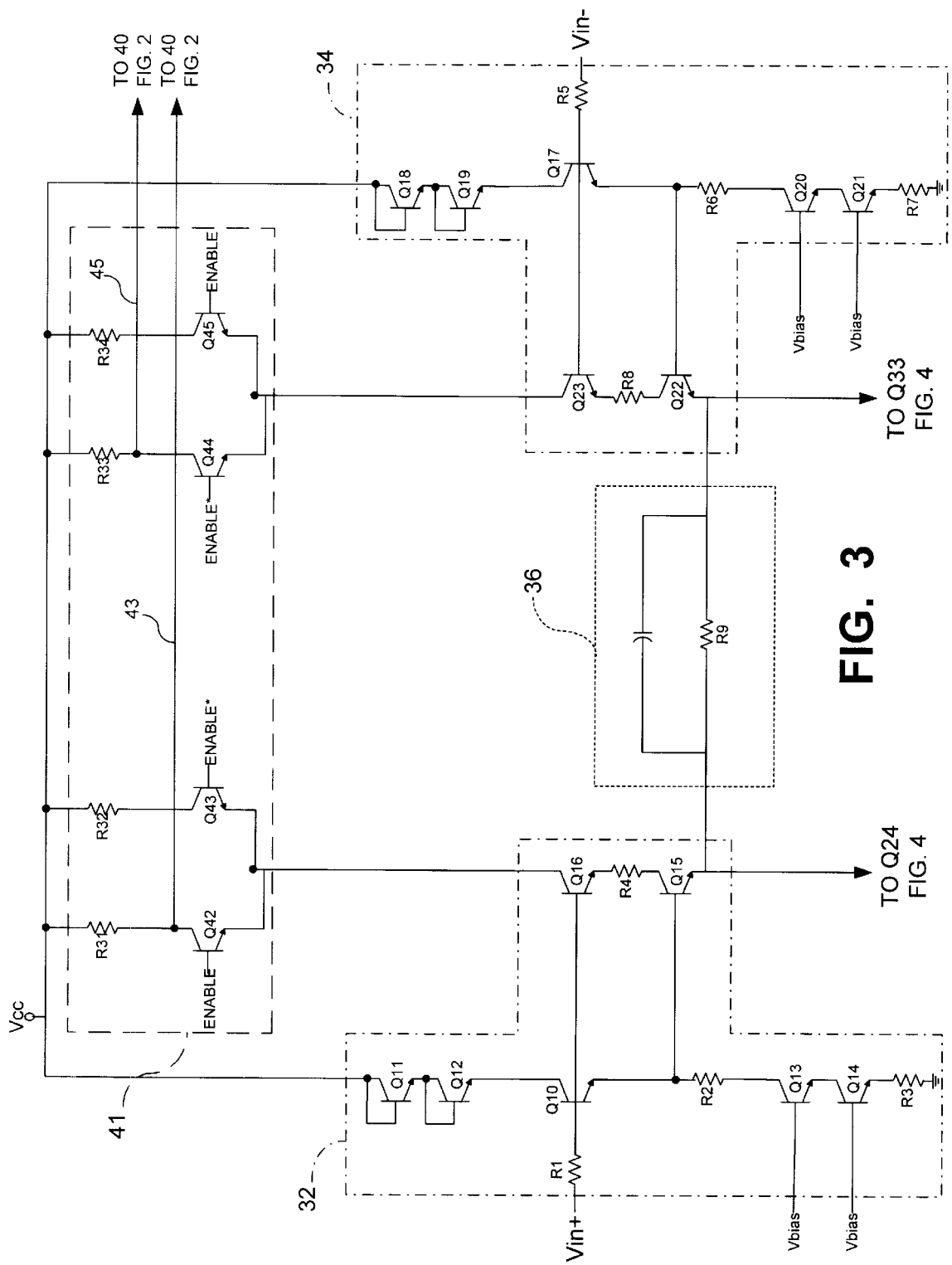
FIG. 3 is a more detailed schematic of the input circuitry and a portion of the latch circuitry of the differential comparator of FIG. 2.

FIG. 3 illustrates a preferred embodiment for each of the input amplifier circuits 32 and 34. Bipolar transistor technology is preferred for constructing most of the comparator circuitry due to the very high speed capabilities that are achievable and the minimal "feature" size of each transistor component. Consequently, the present invention, as more fully described below, lends itself well to implementation as an integrated circuit. It is to be understood, however, that the present invention is not limited to solely bipolar junction transistor (BJT) embodiments. For purposes of clarity, and because the input amplifier circuits 32 and 34 are substantially similar, only the first amplifier circuit 32 will be described in detail.

In an effort to improve the performance of the input amplifier circuitry, and with reference now to FIG. 3, the first input amplifier circuit 32 of the present invention comprises a Darlington-cascode circuit that includes a buffer amplifier in the form of an emitter follower Q10 that receives the input voltage signal Vin+ through resistor R1. A pair of series connected transistors Q11 and Q12 are configured essentially as diodes to provide a 2X Vbe voltage drop from the supply voltage Vcc to the collector of the emitter follower Q10. A biasing network comprising resistors R2 and R3 and series connected transistors Q13 and Q14 draws a predetermined amount of current through Q10. To provide maximum tracking performance, the emitter follower feeds its emitter output directly to the base of a main transistor Q15. This dramatically reduces tracking delays for high-speed input signals. The collector of the main transistor couples to a cascode transistor Q16 through resistor R4.

The resistor R4 plays an important role by isolating the parasitic capacitance of transistor Q15 from transistor Q16, thereby minimizing any "ringing" effects that might occur otherwise. Additionally, the voltage drop on the resistor R4 reduces the collector-to-emitter voltage Vce of transistor Q15 to further minimize any potential self-heating effects without saturating transistor Q15.

As indicated above, the second input amplifier circuit 34 is constructed substantially similar to that of the first amplifier circuit 32, comprising a Darlington-cascode circuit with an emitter follower Q17, a main transistor Q22, and a cascode transistor Q23. Biasing functions are carried out by transistors Q18 through Q21, and resistors R5 through R8.

With further reference to FIG. 3, the voltage reference circuitry 36 preferably comprises an impedance including a resistor R9 that cooperates with a programmable current source 38 (FIGS. 2 and 4) to generate a voltage between the respective emitter outputs, often referred to as the emitter degeneration, of transistors Q15 and Q22. To improve the frequency performance of the stage, and correspondingly reduce the delay (and dispersion), a capacitor C is disposed in parallel with the resistor R9. The resulting effect is similar to the well-known zero-peaked common emitter amplifier.

Referring now to FIG. 4, the current source 38 comprises a voltage-to-current converter that generates a differential current in response to a user-specified voltage input Vref2 and comprises a pair of mirrored circuits 50 and 60, coupled together by a resistor R11. For purposes of clarity, only one of the mirrored circuits will be described in detail, with the understanding that the other circuit is formed substantially similar.

The first mirrored circuit 50 includes a unity-gain buffer amplifier 52 formed by a differential pair of transistors Q27 and Q28 that have respective collectors coupled to the source terminals of a pair of metal-oxide-silicon field effect transistors (MOSFETs) P1 and P2. The MOSFETs provide a relatively constant source of current through the differential pair Q27, Q28. Transistor Q25 provides a feedback path to the base of transistor Q28, providing a feedback control mechanism. Input circuitry comprising transistor Q31 and bias resistors R14–R17 receives a user specified voltage input Vref2. A plurality of current bias paths are defined by transistors Q32, Q29, Q30 and Q26 and corresponding resistors R18–R21.

As explained above, the second mirrored circuit 60 is formed substantially similar to that of the first mirrored circuit 50, but grounds the input to Q40, allowing the input Vref2 at Q31 to steer the current level. The second mirrored circuit further comprises transistors Q33–Q41, and resistors R22–R30. Because the entire voltage-to-current converter 38 is truly differential, the common-mode-rejection (CMR) of the differential comparator is very high and limited only by mismatching components.

Referring back to FIGS. 2 and 3, the comparator 30 produces a differential output at terminals Vo1 and Vo2. However, for those applications desiring a latching capability, the latch circuitry 40 is preferably a "master-slave" flip-flop configuration and couples to the input amplifier circuits 32 and 34 via latch enable circuitry 41. The latch enable circuitry is defined by respective differential pairs of transistors Q42, Q43 and Q44, Q45. Biasing resistors R31 through R34 couple each of the differential pair transistors to the supply voltage Vcc. As is known in the art, the latch enable circuitry responds to differential complementary strobe input signals ENABLE and ENABLE* to provide a differential output along lines 43 and 45 to the main latch circuitry 40 (FIG. 2). The remainder of the latch circuitry comprises transistor implementations of flip-flop constructions that are well known to those skilled in the art, warranting no further description.

The differential comparator of the present invention lends itself well to implementation on a small portion of an integrated circuit as part of the channel architecture for a semiconductor tester (not shown). It is anticipated that such an architecture includes both comparator circuitry (such as that disclosed herein) and driver circuitry (not shown), such as that disclosed in pending U.S. Pat. Ser. No. 09/253,175, filed Feb. 19, 1999, titled "Serial Switch Driver Architecture For Automatic Test Equipment", assigned to the assignee of the present invention, and expressly incorporated herein by reference. Because of the low dispersion characteristics realized by the single-stage construction, the differential comparator is especially useful for testing high-speed semiconductor devices on a high-speed and high-accuracy semiconductor tester.

In operation, the differential comparator of the present invention generally compares a difference voltage representing the difference between the complementary differential output voltages (Vin+−Vin−) at a precise instant of time from a device-under-test (DUT) to a user-specified threshold reference level Vref. Depending on the result of the comparison, the comparator will either latch a high state or low state to represent a "fail" or a "pass" for the particular difference signal detected. The latched information is then fed to a failure processor (not shown) for analysis. The comparison and latching steps take place for user-specified cycles of the DUT output data, which may approach frequencies on the order of a gigahertz and higher.

Figure 5:
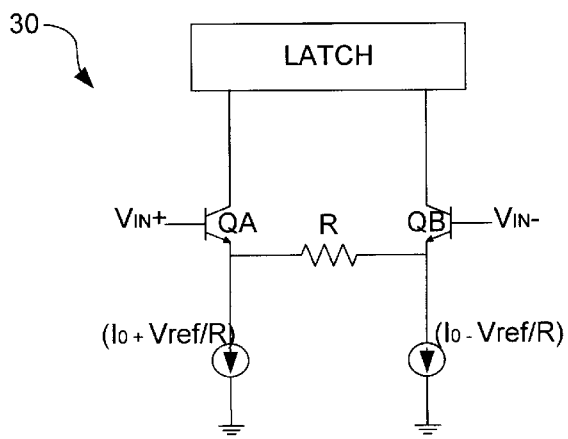
FIG. 5 is a high-level block diagram similar to that of FIG. 2.

FIG. 5 is useful to understand generally how the differential comparator operates during a test. The voltage difference Vref is impressed across the emitter degeneration, or reference terminals, between the respective amplifier circuits 32 and 34 (represented generally by transistors QA and QB). If the detected difference voltage (Vin+−Vin−)=Vref, no current will pass through the resistor R. As a result, the collector currents of QA and QB, respectively, are equal. This is effectively the =balance point for the latch circuitry 40. However, if the difference voltage detection results in the relationship (Vin+−Vin−)>Vref, most of the current will conduct through the amplifier circuit associated with the input signal Vin+. This results in a "greater than" comparison that causes the latch to settle to one state (assuming the latch is enabled by a strobe signal). Similarly, if the compared relationship is (Vin+−Vin−) <Vref, most of the current will conduct through the amplifier associated with the input signal Vin−. This results in a "less than" comparison that causes the latch to settle to the other state.

In this manner, the difference voltage (Vin+−Vin−) is detected substantially simultaneous with the comparison to the reference voltage Vref. This, along with implementing the latch circuitry at the input amplifier circuits, allows for the application of one differential amplifier stage to carry out the key detection and comparison functions, correspondingly reducing the effects of dispersion.

The threshold reference voltage Vref is conveniently programmable to a desired level for maximum tester flexibility by specifying the voltage input Vref2 of the voltage-to-current converter 38. The unity gain buffer circuits respond to voltage input reference by generating respective subcurrents i1 and i2 that together with resistor R11, generates respective first and second voltages V0 and V1 at the output of the respective emitters of transistors Q15 and Q22 (FIG. 3). Consequently, the potential difference between V0 and V1 defines the reference voltage Vref.

Those skilled in the art will appreciate the many benefits and advantages afforded by the present invention. Of particular importance is the implementation of the latch circuitry at the comparator input stage. This provides for a single stage construction to minimize dispersion. This is achieved by employing the voltage reference circuitry between the input amplifier circuits. Additionally, self-heating effects at the comparator differential inputs are significantly suppressed through the improved input circuit configuration. By minimizing dispersion, the delay associated with the differential comparator remains relatively constant in response to changes in operating parameters. This, in turn allows the tester to realize very high signal timing accuracies.

While the invention has been particularly shown and described with reference to the preferred embodiments thereof, it will be understood by those skilled in the art that various changes in form and detail may be made therein without departing from the spirit and scope of the invention. For example, while much of the description herein focuses on bipolar transistor circuitry, it should be understood that other transistor technologies such as CMOS, GaAs, BiCMOS, etc. are intended to be within the scope of the invention. Moreover, although the input amplifier circuits have been described in the context of a differential comparator, the amplifier circuit is applicable to many kinds of analog circuit blocks such as filters, drivers, and the like.

Additionally, the differential comparator of the present invention could be slightly modified to compare differential input current signals, rather than the described voltage input signals. The reference circuitry would then involve reference current circuitry for comparing to the input current signals.

What is claimed is:

1. A differential comparator including:
   first and second input amplifier circuits having respective signal input terminals for receiving respective first and second complementary input signals, said first and second input amplifier circuits of an differential pair configuration including respective output terminals and operative to produce respective output signals that collectively represent a difference signal, each of said input amplifier circuits comprises a Darlington-cascode amplifier circuit, said Darlington-cascode amplifier circuit including:
      a Darlington amplifier having a first emitter follower with a first base input and an emitter output, and a second emitter follower having a second base input and a second collector terminal, said second base input directly connected to said first emitter follower output; and
      a cascode transistor including a base coupled to said first base input and an emitter disposed in series with said second collector; and
   reference signal circuitry coupled to said input amplifier circuits, said reference signal circuitry operative to produce a predetermined reference signal for comparison to said difference signal, said input amplifier circuits and said reference signal circuitry cooperating to define a single.

2. A differential comparator according to claim 1 and further including:
   an impedance interposed in series between said cascode emitter and said second emitter follower collector.

3. A differential comparator according to claim 1 wherein:
   said reference circuitry includes a voltage-to-current converter disposed in series with said differential pair configuration and an impedance interposed between said differential pair, said impedance operative to cooperate with said voltage-to-current converter to generate said reference voltage.

4. A differential comparator according to claim 3 wherein:
   each of said amplifier circuits includes respective emitters that cooperate to form an emitter degeneration; and
   said reference circuitry couples to said emitter degeneration to impress said reference voltage thereacross.

5. A differential comparator for use in a semiconductor tester channel architecture to compare the output differential voltage from a device-under-test to a predefined reference voltage, said differential comparator including:
   first and second input amplifier circuits disposed in a differential pair configuration for receiving respective first and second complementary input voltages, said first and second input amplifier circuits cooperating to produce a difference voltage representing the difference between said input voltages; and
   reference voltage circuitry coupled to said input amplifier circuits, said reference voltage circuitry including a programmable current source disposed in series with said input amplifier circuits, and an impedance interposed between the outputs of said input amplifier circuits, said impedance and current source cooperating to generate a reference voltage.

6. A differential comparator for use in a semiconductor tester channel architecture according to claim 5 and further including:
   latch circuitry coupled to said respective input amplifier circuits for latching one of a plurality of predetermined states when a predetermined condition between said d difference voltage and said reference voltage is satisfied.

* * * * *

UNITED STATES PATENT AND TRADEMARK OFFICE
CERTIFICATE OF CORRECTION

PATENT NO. : 6,300,804 B1
DATED : October 9, 2001
INVENTOR(S) : Morteza Vadipour It is certified that error appears in the above-identified patent and that said Letters Patent is hereby corrected as shown below:

<u>Column 6,</u>
Line 19, "define a single." should read -- define a single stage. --

Signed and Sealed this

Fourteenth Day of May, 2002

*Attest:*

*Attesting Officer*

JAMES E. ROGAN
*Director of the United States Patent and Trademark Office*